United States Patent
Shao et al.

(10) Patent No.: US 11,683,916 B2
(45) Date of Patent: Jun. 20, 2023

(54) EFFICIENT AND ROBUST SYSTEM DESIGN AND CONTROL METHOD USING THERMOELECTRIC COOLING

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 142 days.

(21) Appl. No.: 17/212,075

(22) Filed: Mar. 25, 2021

(65) Prior Publication Data

US 2022/0312644 A1  Sep. 29, 2022

(51) Int. Cl.
| | | |
|---|---|---|
| H05K 7/20 | (2006.01) | |
| G05B 15/02 | (2006.01) | |
| H01L 23/38 | (2006.01) | |
| G06F 1/20 | (2006.01) | |

(52) U.S. Cl.
CPC ......... *H05K 7/20836* (2013.01); *G05B 15/02* (2013.01); *H05K 7/20272* (2013.01); *H05K 7/20781* (2013.01); *G06F 1/206* (2013.01); *H01L 23/38* (2013.01); *H05K 7/20281* (2013.01); *Y02D 10/00* (2018.01)

(58) Field of Classification Search
USPC .................................................. 700/276, 300
See application file for complete search history.

(56) References Cited

U.S. PATENT DOCUMENTS

| | | | |
|---|---|---|---|
| 10,667,427 B2 * | 5/2020 | Gao .................... | H05K 7/20781 |
| 2016/0239067 A1 * | 8/2016 | Lovicott ................ | G06F 1/206 |
| 2017/0242463 A1 * | 8/2017 | Matteson ............... | G05B 15/02 |
| 2019/0110379 A1 | 4/2019 | Cui et al. | |
| 2020/0315059 A1 | 10/2020 | Gao | |
| 2021/0084797 A1 | 3/2021 | Shao et al. | |
| 2021/0373531 A1 * | 12/2021 | Reddell .............. | G05B 19/4155 |

* cited by examiner

*Primary Examiner* — Emilio J Saavedra
(74) *Attorney, Agent, or Firm* — Womble Bond Dickinson (US) LLP

(57) ABSTRACT

A cooling system comprises a board management controller (BMC), a thermoelectric cooling (TEC) controller, and a cooling distribution unit (CDU) controller. The BMC monitors a cooling system to obtain a first power value representing a power consumed by an electronic device, performs a lookup operation in a control lookup table based on the first power value, and determines a first thermoelectric cooling (TEC) current and a first pump speed based on the lookup operation. The TEC controller is to control a TEC device attached to the electronic device to cause the first TEC current to flow within the TEC device. The CDU controller is to configure a pump speed of a fluid pump of the CDU according to the first pump speed.

20 Claims, 7 Drawing Sheets

EFFICIENT AND ROBUST SYSTEM DESIGN AND CONTROL METHOD USING THERMOELECTRIC COOLING

FIELD OF THE INVENTION

Embodiments of the present invention relate generally to data centers. More particularly, embodiments of the invention relate an efficient and robust system design and control method using thermoelectric cooling.

BACKGROUND

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Immersion cooling technology has brought many attentions recently. Many efforts are focusing on the fluid selection, information technology (IT) side design, material compatibilities, test and verification, and so on. Most of the solutions utilize existing cooling infrastructure (cooling water/chilled water) or system. In some of the solutions, a coolant distribution unit (CDU) is used to form an external cooling loop and an internal immersion cooling fluid loop. The external cooling loop can be adapted to any type of existing data center cooling infrastructures. These solutions may not fully utilize the advantages of immersion cooling.

Thermoelectric cooling (TEC) technology also has also been spotlighted recently. Thermoelectric coolers have their own COP (coefficient of performance) optimization methods. The maximized COP is the lowest power overhead for a specific cooling power capacity of a TEC device. When a TEC device is embedded in an immersion-cooled IT equipment, the optimization of the entire cooling power consumption calculation including the TEC power over head and fluid pump power needs to be addressed.

One of the promising applications of immersion cooling systems is its outdoor edge computing equipment. However, the weather has an impact on the system operation. For example, in a cold weather, the computing chip may be below its lowest temperature limit to function.

When the fluid pump fails, the IT equipment performs certain operations before shutting down. These operations include backing up data in memory or transferring work load. At the same time, the dielectric fluid temperature continues increasing during these operations. A sufficiently large time window before shutting down IT equipment is essential to have a more robust immersion cooling system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
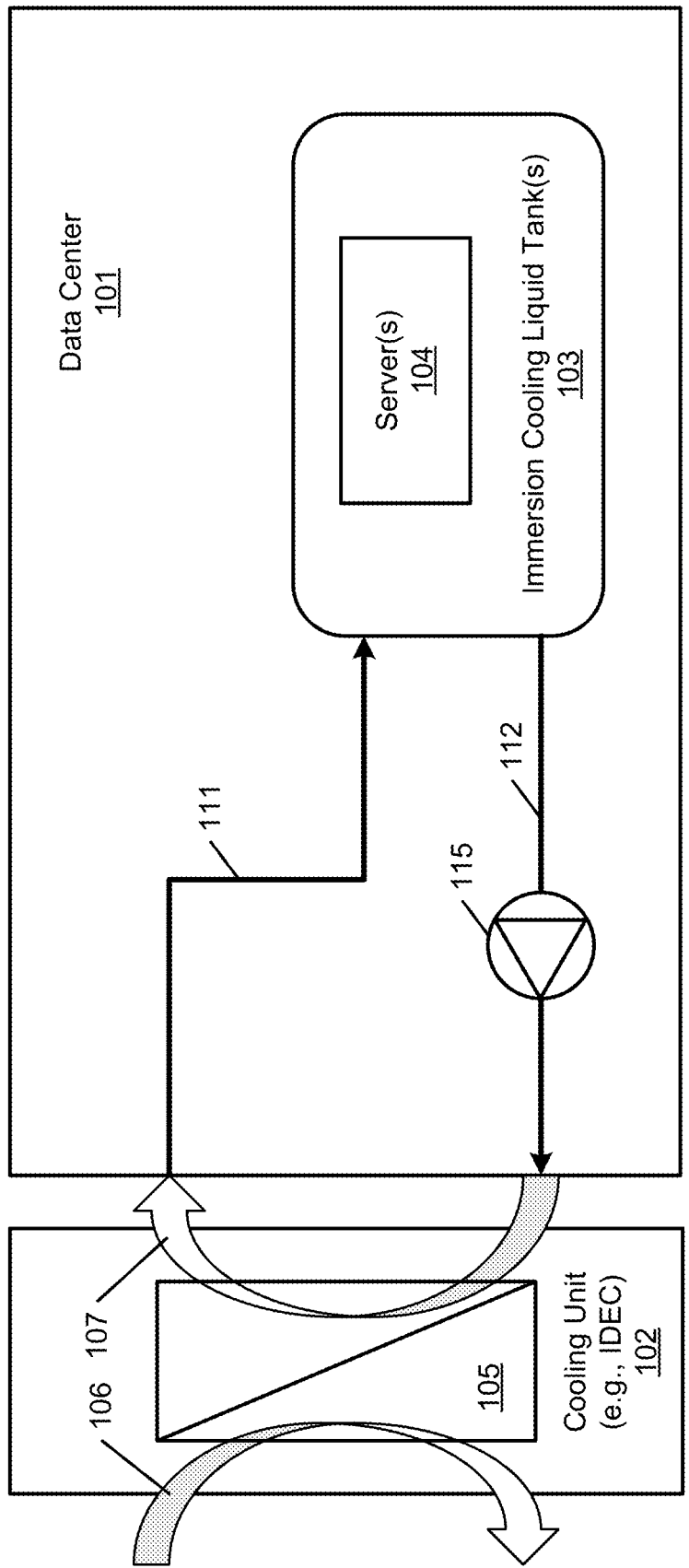
FIG. 1 is a block diagram illustrating an example of a data center system with thermoelectric cooling according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The IT Hardware industry is a critical market for many reasons: it plays a crucial role in business competitiveness, service quality and availability, and also plays a significant role in the infrastructure TCO. IT Hardware is closely linked with the profit of an organization. It is one of the core competencies of the internet giant, cloud computing service providers, as well as high performance computing and AI computing related business service users and providers who build, operate, compute, store and manage other IT hardware platforms and infrastructures. The majority of the hyperscale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, and cost effective solutions and architecture.

In this disclosure, an immersion cooling system is discussed. In an embodiment, an immersion cooling tank consists of dielectric fluid, IT equipment (graphics/general processing unit or GPU cards, GPU baseboard), thermoelectric cooling (TEC) devices and TEC controllers which are embedded in the IT equipment. In an embodiment, a CDU is outside the immersion tank, including a fluid pump, a heat exchanger and a CDU controller. In an embodiment, the cooling system can make a real-time optimization of the pump speed and TEC current, to minimize the system's cooling power consumption, based on monitoring the computing chip's power in real-time.

In an embodiment, the system can be featured under the heating mode via TEC devices. For example, when this immersion system is used as edge computing equipment, the dielectric fluid temperature may be so low that the computing chip is not able to start. In this condition, TEC devices can be controlled to work in a heating mode, with no additional heating source needed, according to an embodiment. In an embodiment, the TEC device works as a heat pump to move the energy from the liquid (lower temperature) to the chip (higher temperature) so that the chip is preheated to a desired temperature.

In an embodiment, this system can perform self-protection via TEC devices when the pump fails. In an embodiment, upon pump failure, the fluid is not driven by external forces any more. For example, as the chip keeps generating heat, the fluid's temperature keeps increasing. Therefore, in an embodiment, the fluid may become very hot in a short amount of time. Then, IT equipment is not able to finish backing up data or transfer the workload, and shuts down instead. In an embodiment, with the higher current, the controller is able to let the TEC device cool the chip with higher fluid temperature, and this gives a larger time window for the system to finish necessary operations before shutting down.

In an embodiment, a data center system comprises a plurality of electronic racks, each electronic rack including one or more servers; and a cooling system coupled to the electronic racks to provide liquid cooling to the servers. In an embodiment, a cooling system comprises a board management controller (BMC), a thermoelectric cooling (TEC) controller, and a cooling distribution unit (CDU) controller.

In an embodiment, a BMC is configured to monitor the cooling system to obtain a first power value representing a power consumed by an electronic device. In an embodiment, a BMC is configured to perform a lookup operation in a control lookup table based on the first power value. In an embodiment, a BMC is configured to determine a first thermoelectric cooling (TEC) current and a first pump speed based on the lookup operation.

In an embodiment, a TEC controller is configured to receive a first control signal from the BMC to control a TEC device attached to the electronic device to cause the first TEC current to flow within the TEC device. In an embodiment, a CDU controller is configured to receive a second control signal from BMC to configure a pump speed of a fluid pump of the CDU according to the first pump speed.

In an embodiment, the control lookup table includes a number of entries, each entry mapping a particular power value to an optimal TEC current and an optimal pump speed corresponding to that particular power value. In an embodiment, a cooling system further includes an emersion tank to contain the electronic device and the TEC device submerged into the cooling fluid contained therein. In an embodiment, the CDU is located outside of the emersion tank.

In an embodiment, the BMC is configured to monitor the cooling system for a predetermined period of time to obtain a first power value. In an embodiment, the first TEC current and the first pump speed are determined based on the lookup operation, such that power consumption of the cooling system reaches minimum while satisfying a thermal requirement of the electronic device.

In an embodiment, the TEC controller is configured to cause a TEC current to flow in a first direction within the TEC device when the fluid temperature of the cooling fluid drops below a first predetermined temperature threshold, which causes the TEC device to operate in a heating mode. In an embodiment, the TEC controller is configured to cause the TEC current to flow in a second direction within the TEC device when the fluid temperature rises above a second predetermined temperature threshold, which causes the TEC device to operate in a cooling mode.

FIG. 1 is a block diagram illustrating a data center system according to one embodiment. Referring to FIG. 1, data center immersion cooling system 100 is referred to as a data center system with immersion cooling. In one embodiment, data center immersion cooling system 100 includes data center or data center unit 101 coupled to external cooling unit 102. External cooling unit 102 may be an indirect evaporative cooling (IDEC) unit. Cooling unit 102 includes a heat exchanger 105, which may be a liquid-to-liquid heat exchanger or an air-to-liquid heat exchanger. Typically, heat exchanger 105 includes a primary loop 106 and a secondary loop 107. Primary loop 106 is utilized to circulate external cooling source such as external air or external liquid. Secondary loop 107 is utilized to circulate internal cooling liquid to exchange heat with the external cooling material of primary loop 106.

In one embodiment, data center 101 includes an immersion tank 103 filled with the internal cooling liquid, i.e., immersion cooling liquid. Although there is one immersion tank shown herein, more immersion tanks can also be included within data center 101. Immersion tank 103 contains one or more server systems 104 and each server blade includes one or more IT components (e.g., processors, memory, storage devices). Server systems 104 are submerged in the internal cooling liquid. The internal cooling liquid is thermally conductive dielectric liquid designed to extract the heat from the server systems. Such cooling technique is referred to as immersion cooling.

Server immersion cooling is a computer cooling practice by which computer components or servers are submerged in a thermally conductive dielectric liquid. For example, common dielectrics which are suitable for immersion cooling are typically oil-based. Server immersion cooling has the potential of becoming a popular server cooling solution for green data centers, as it allows them to drastically reduce their energy load, regardless of their PUE. Servers and other IT hardware cooled by immersion cooling do not require fans, thus these are removed.

Referring back to FIG. 1, according to one embodiment, data center 101 includes a liquid supply line 111 and a liquid return line 112 coupled to the secondary side of the heat exchanger 105 of cooling system 102 to form the secondary loop. In addition, liquid supply line 111 is coupled to an intake port of immersion tank 103 and liquid return line 112 is coupled to an outlet port of immersion tank 103. Liquid supply line 111 is configured to receive the cooling liquid from heat exchanger 105 and to distribute the cooling liquid to immersion tank 103. Liquid return line 112 is configured to receive the cooling liquid carrying the heat exchanged from server blades 104 from immersion tank 103 and to return the cooling liquid back to heat exchanger 105 for heat exchange.

In addition, a liquid pump 115 may be disposed on liquid return line 112 to pump and circulate the cooling liquid to flow within the secondary loop. In addition, multiple pumps may be designed in the system (on main supply line 111 or on main return line 112 for redundant purpose. Note that if there are multiple immersion tanks within data center 101, there will be multiple pairs of liquid supply line and liquid return line to couple the immersion tanks with heat exchanger 105 of cooling system 102. Unlike conventional cooling systems, the secondary loop 107 via liquid supply line 111, immersion tank 103, and liquid return line 112 is a single heat transfer loop without using a CDU in between. Typically, a CDU also includes a heat exchanger having a primary loop and a secondary loop therein, which will form multiple loops between cooling system 102 and immersion tank 103. Also note that liquid pump 115 may be disposed on liquid supply line 111 or alternatively, there may be multiple liquid pumps, one disposed on liquid supply line 111 and another one disposed on liquid return line 112.

Figure 2:
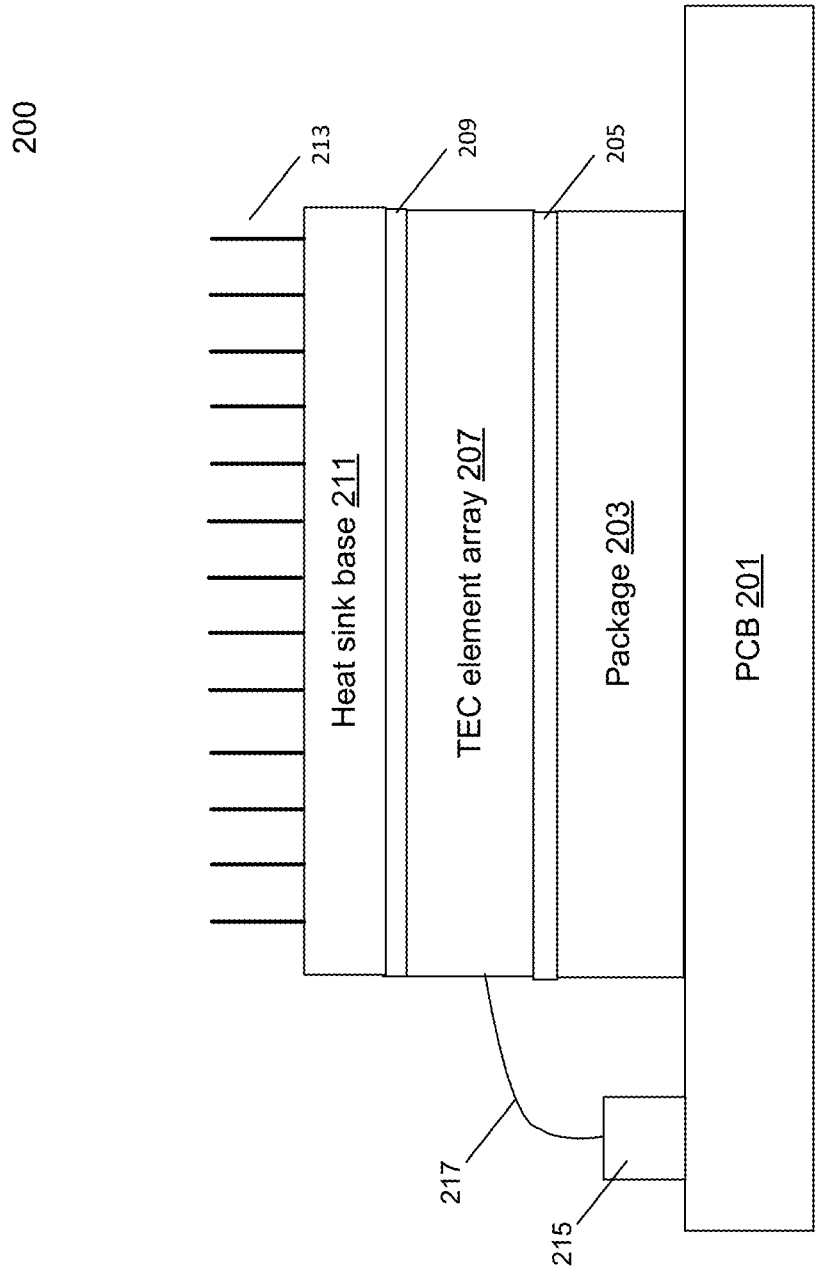
FIG. 2 is a block diagram illustrating an example of a portion of data center system with thermoelectric cooling according to another embodiment.

FIG. 2 is a block diagram illustrating an example of a data center system 200 with thermoelectric cooling according to another embodiment. For example, FIG. 2 shows the system design view from the front side. The thermoelectric cooling system 200 may be utilized as a part of cooling system 100 of data center 101 as shown in FIG. 1. For example, the entire system 200 may be submerged into the coolant within the emersion tank as shown in FIG. 1. In an embodiment, the TEC element is disposed between computing chip and a heat sink. For example, the TEC element, including TEC element array 207 disposed between TIMs (205, 209), disposed between a heat sink, which includes heat sink fins 213 disposed on the heat sink base 211, and a computing device, which is part of a package 203 disposed on a printed circuit board (PCB) 201. In an embodiment, a TEC controller is disposed on the PCB, on the side of the package 203, connected with the TEC element array 207 via a wire 217. The TEC controller 215 is configured to control an electric current flowing within TEC element array 207. The flowing direction of the electric current within TEC element array 207 determines the operating mode of the TEC element array 207, either in a heating mode or a cooling mode. When operating in a heating mode, TEC element array 207 is configured to preheat package 203, and when operating in a cooling mode, TEC element array 207 is configured to provide cooling to package 203.

Figure 3:
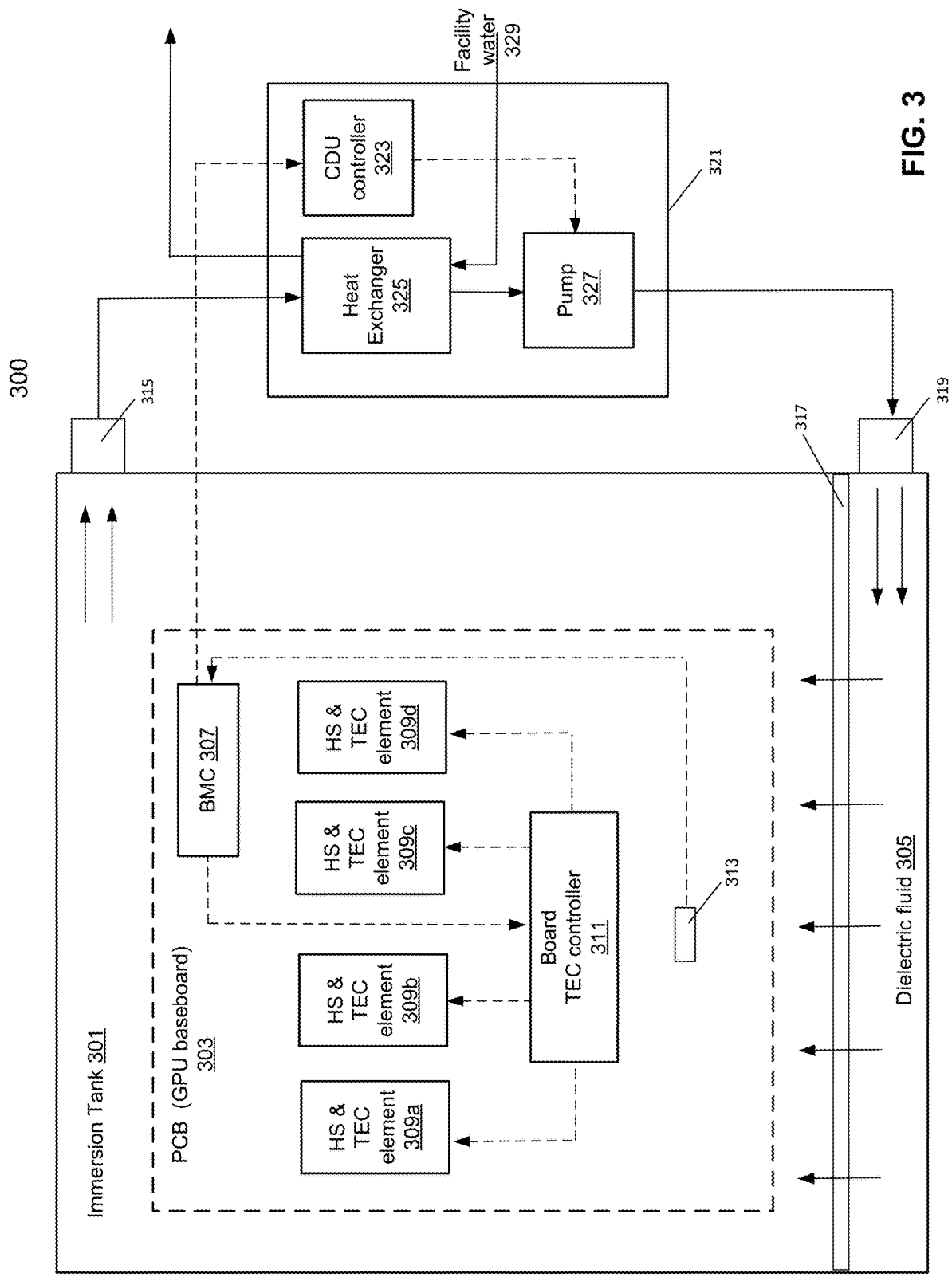
FIG. 3 is a block diagram illustrating an example of a data center system with thermoelectric cooling according to an embodiment.

FIG. 3 is a block diagram illustrating an example of a data center system 300 with immersion cooling according to an embodiment. FIG. 3 shows a GPU computing system configuration with immersion cooling and TEC device according to an embodiment. Note that a GPU is utilized as an example of a data processing accelerator, however, other types of data processing logic may also be applicable. In an embodiment, this design is a highly combined design with IT equipment. For example, it can be seen that some basic sections are the same as shown in FIG. 2.

In an embodiment, an immersion cooling tank 301 consists of dielectric fluid 305, IT equipment (GPU cards, GPU baseboard) 303, thermoelectric cooling (TEC) devices (309a, 309b, 309c, 309d) and TEC controllers 311 which are embedded in the IT equipment. In an embodiment, a CDU 321 is outside the immersion tank 301, including a fluid pump 327, a heat exchanger 325 and a CDU controller 323. In an embodiment, the heat exchanger 325 can perform its heat exchange function by using facility cooling liquid such as water 329. In an embodiment, the CDU 321 is connected with immersion tank 301 through fluid port 315, 319. In an embodiment, the dielectric fluid 305 flows through the perforated panel 317 from the fluid port 319 and exits immersion tank through the fluid port 315.

In an embodiment, the Board Management Controller (BMC) 307 can read GPU power/temperature/fluid inlet temperature (temperature sensor 313 is located near the perforated panel 317), can send control single to an on-board TEC controller 311 and CDU controller 323. In one embodiment, BMC 307 can determine the power consumption of a processor, for example, by determining an electric current drawn by the processor and a voltage applied to the processor using proper current and voltage sensors. That is the power consumption of the processor can be calculated as power=current*voltage. The power consumption can be utilized as an index for a lookup operation in a predetermined control lookup table, which in turn determines the optimal TEC current to be applied to TEC elements 309a-309d (collectively referred to as TEC elements 309) and the optimal pump speed to control the pump speed of pump 327. Further detailed information concerning the control lookup table and the lookup operation will be described in details further below.

In an embodiment, the on-board TEC controller 311 provides electric current to each of the TEC devices (309a, 309b, 309c, 309d). The TEC controller 311 can regulate the current upon receiving the control signal from Board Management Controller (BMC) 307 according to an embodiment. In an embodiment, the CDU controller 323 can send a control signal to the fluid pump 327 to change the pump speed. BMC 307 instructs TEC controller 311 to cause an electronic current to flow through the TEC devices in a particular direction (e.g., heating mode or cooling mode) based on an optimal TEC current obtained via the lookup operation in the control lookup table in view of the chip power consumption at the point in time. Similarly, BMC 307 instructs the CDU controller 312 (or the pump controller) to set the pump speed of the fluid pump 327 based on the optimal pump speed obtained via the lookup operation. As a result, the cooling system (e.g., TEC devices and CDU) consumes the minimum (or optimal power) while provide sufficient cooling (and/or heating) to the electronic devices.

In an embodiment, the governing equations of the system are shown below:

$$\begin{cases} Q_0 = n\left[\alpha T_{case} I - \frac{1}{2} I^2 R - K(T_{hs,b} - T_{case})\right] & \text{Eqn}(1) \\ \dfrac{T_{hs,b} - T_{liquid,in}}{Q_0 + Q'} = \left(\dfrac{v_{pump,max}}{v_{pump}}\right)^{0.8} \hat{R}_{th,hs} & \text{Eqn}(2) \\ Q' = n\alpha I(T_{hs,b} - T_{case}) + I^2 R & \text{Eqn}(3) \end{cases}$$

For example, the above system specifications include: number of TEC element n serially connected in a TEC device, TEC element material constant 1, α(Seebeck coefficient, related to thermoelectric mechanism), TEC element material constant 2, K (thermal conductance), TEC element material constant 3, R (electrical resistance), reference value of thermal resistance of heat sink on top of the chip, $\hat{R}_{th,hs}$. Further, the above system specifications include that the operating condition is fluid inlet temperature $T_{liquid,in}$; the work load is chip generating power $Q_0$; the control parameters include Pump speed $v_{pump}$, TEC current I; the system parameters are to determine (unknown): the TEC power overhead Q'(additional power needed when TEC is functioning); the chip case temperature $T_{case}$, and the heat sink base temperature $T_{hs,b}$.

Since there are 3 unknown parameters in 3 governing equations, with a given fluid inlet temperature $T_{liquid,in}$, the TEC power overhead Q' and chip case temperature $T_{case}$ can be calculated. These definite relations can be denoted as $f_1$ and $f_2$.; $Q'=(Q_0, I, v_{pump})$; and $T_{case}=f_2(Q_0, I, v_{pump})$. Please be noted that we consider $T_{hs,b} > T_{case}$ as a practical working condition when TEC is in cooling mode. Note that for a particular configured emersion cooling system, the fluid inlet temperature is maintained within a predetermined range as a part of the design configuration. Such fluid inlet temperature normally would not and should not change significantly over the course of operations. The goal is for the cooling system to consume minimum power while maintain the fluid temperature of the cooling fluid within the predetermined range by finding the optimal TEC current and optimal pump speed of the liquid pump.

In an embodiment, the cooling power consumption $Q_{cooling}$ for the entire system consists of TEC power overhead and the pump power, which are expressed as below:

$$Q_{cooling} = Q' + P_{pump} = f_1(Q_0, I, v_{pump}) + \beta v_{pump}^3 \quad \text{Eqn. (4)}$$

In an embodiment, the description of optimization can be expressed as: an optimal TEC current and an optimal pump speed can let the cooling power consumption of an immersion cooling system reach a minimum value, under a condition of a fluid temperature and a chip work load. That is, for a given fluid temperature and a given chip power consumption, an optimal TEC current and an optimal pump speed can be derived using the above formulas, in which the power consumption by the cooling system reaches minimum, while satisfying the thermal requirement (e.g., fluid temperature within a particular range by design). In an embodiment, mathematically, the optimization is stated as follows: finding an optimal system operational setting of $(I, v_{pump})$ so that the total cooling power consumption $Q_{cooling}$ is minimum, while $T_{case} < T_{case,max}$, $I_{min} \leq I \leq I_{max}$, $v_{pump,min} \leq v_{pump} \leq v_{pump,max}$.

Initially, the BMC monitors the chip power $Q_0$, for a period of time such as 1 minute. The chip power for the purpose of determining the optimal TEC current and pump speed may be determined based on the averaged chip power measured over the period of time. The chip power of a particular point in time can be determined based on the electric current drawn by the chip and the voltage applied to the chip.

The BMC can search $Q_0$ value in the predefined Control Look-up Table in BMC's memory, determine the optimal TEC current $I^*$ and the optimal pump speed $v^*_{pump}$. For example, For $Q_0=400$ W, $I^*=1$ A and $v^*_{pump}=1000$ RPM.

Based on the lookup operation, BMC sends a control signal (e.g., current, voltage) to TEC controller. In the meantime, BMC sends a control signal (e.g., current, voltage) to CDU controller, the CDU controller then sends a control signal the liquid pump. In response, TEC controller generates current and TEC device operates at $I^*$ and the fluid pump operates at the speed $v^*_{pump}$. The above operations may be iteratively performed.

Figure 4:
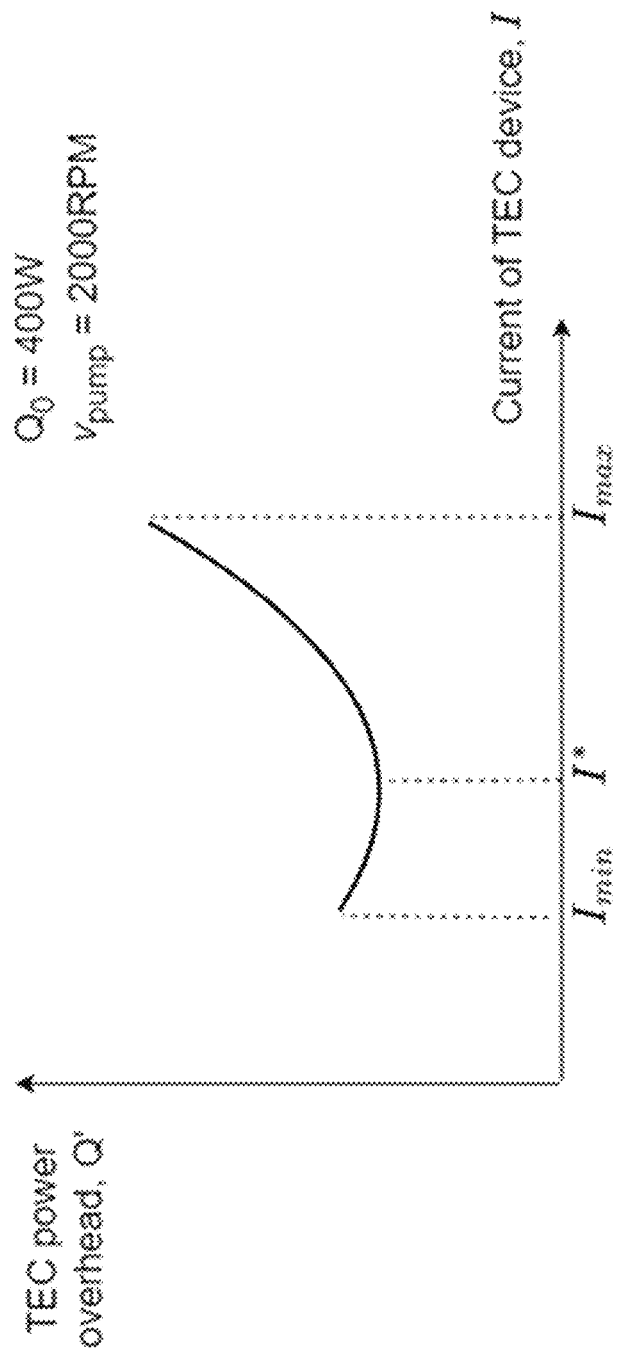
FIG. 4 is a graph diagram of the TEC power over head versus the current of TEC device according to an embodiment.

FIG. 4 is a graph diagram of the TEC power over head versus the current of TEC device according to an embodiment. For example, at operation 1, the system determines the optimal control parameters for a single value chip power $Q_0$. In FIG. 4, $Q'$ vs. I has a trend as the curve in the FIG. 4. In an embodiment, the FIG. 4 shows TEC power overhead vs. TEC current. In an embodiment, the tendency of $Q'$ can be analyzed to give a simple explanation. For example, equation (3) is shown again as below:

$$Q' = n\alpha I(T_{hs,b} - T_{case}) + I^2 R$$

In an embodiment, when I is near $I_{min}$ ($I_{min} > 0$), the first term is supposed to be large due to large $(T_{hs,b} - T_{case})$. In an embodiment, when I is near $I_{max}$, the second term is supposed to be large. That is, the tendency of $Q'$ is at first decreasing and then increasing.

In an embodiment, for one pump speed $v_{pump,1}$, the $I^*_1$ can be obtained for the local minimum $Q'$. In an embodiment, the system can select some pump speeds between $v_{pump,min}$ and $v_{pump,max}$ (e.g., $v_{pump,1}=1000$ RPM, $v_{pump,2}=1500$ RPM, $v_{pump,3}=2000$ RPM) to generate specific $I^*$ values, shown as below:

In an embodiment, under chip power's real-time, $$Q_0: (I^*_1, v_{pump,1}); (I^*_2, v_{pump,2}); (I^*_3, v_{pump,3});$$

In an embodiment, substituting $(I^*_i, v_{pump,i})$ into Eqn. (4) and comparing each corresponding cooling power consumption $Q_{cooling}$, the system can select the lowest value of $Q_{cooling}$ as the global minimum. Thus, the control parameters $(I^*, v^*_{pump})$ for the global minimum $Q_{cooling}$, under chip power $Q_0$ is defined according to an embodiment.

At operation 2, the system can change the value of $Q_0$ and repeat operation 1.

At operation 3, the system can generate a Control Look-up Table in a format as below:

$$Q_0 = 50W: (I^{*(1)}, v^{*(1)}_{pump})$$

$$Q_0 = 100W: (I^{*(2)}, v^{*(2)}_{pump})$$

$$Q_0 = 150W: (I^{*(3)}, v^{*(3)}_{pump})$$

$$\ldots Q_0 = Q_0^{(N)}: (I^{*(N)}, v^{*(N)}_{pump})$$

In an embodiment, the size of this Table, N, depends on the allowable memory space in the BMC. In one embodiment, if the operating condition $T_{liquid,in}$ (inlet fluid temperature) changes, the Control Look-up Table should be redefined. In one embodiment, the lookup table includes a number of entries, each entry corresponding to a particular $Q_0$. Each entry maps a particular $Q_0$ to an optimal TEC current and an optimal pump speed. Note that each lookup table is trained and constructed for a particular predefined cooling system. Typically, a cooling system is designed to maintain the fluid temperature of the cooling fluid within a predetermined range. The TEC and CDU (e.g., pump) power consumption is proportional to the fluid temperature to be maintained. Thus, a control lookup table is associated with a particular range of the fluid temperatures, assuming the fluid temperature will not change significantly during the normal operations.

In one embodiment, the system may be configured as a universal system for a variety of liquid cooling requirements (e.g., different fluid temperatures). As a result, the system maintains a list of multiple control lookup tables, each corresponding to a different one of temperature ranges. The control lookup tables may be trained and configured under the similar cooling system environments. During the normal operations, dependent upon the specific fluid temperature (e.g., measured at an inlet), a proper one of the control lookup table is selected from the list of control lookup tables.

During the operations, the system can determine the chip power consumption $Q_0$, for example, based on the current and voltage drawn by the chip. Based on the chip power value representing the power consumption, a lookup operation is performed to locate an entry matching the chip power value and to obtain the optimal TEC current and optimal pump speed from the matching entry.

Figure 5:
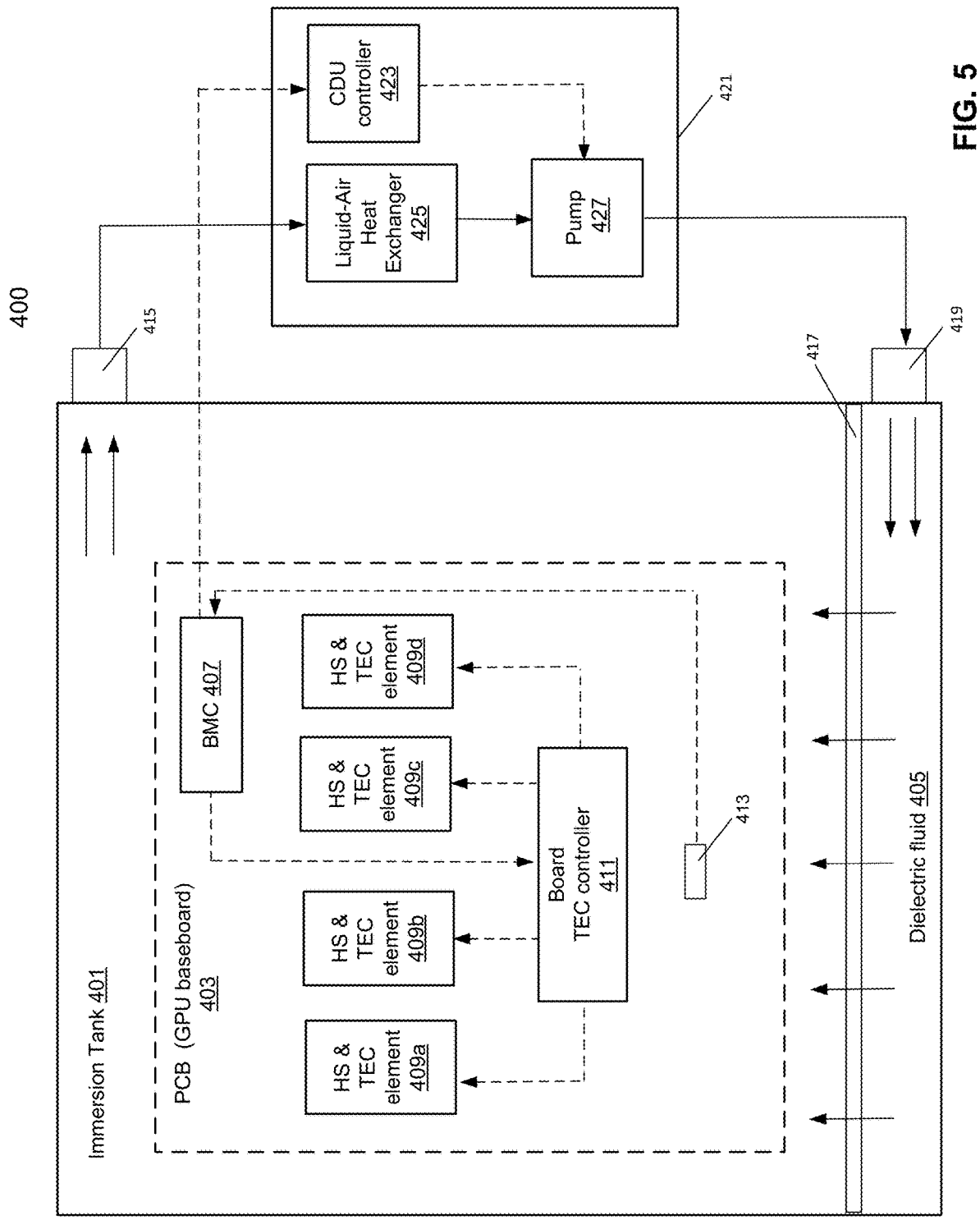
FIG. 5 is a block diagram illustrating another example of a data center system with thermoelectric cooling according to another embodiment.

FIG. 5 is a block diagram illustrating an example of a data center system 400 with thermoelectric cooling for outdoor edge computing according to an embodiment. FIG. 5 shows a GPU computing system configuration with immersion cooling and TEC device for outdoor edge computing according to an embodiment. In an embodiment, this design is a highly combined design with IT equipment. For example, it can be seen that some basic sections are the same as shown in FIG. 2.

In an embodiment, an immersion cooling tank 401 includes dielectric fluid 405 (liquid and/or air), IT equipment (GPU cards, GPU baseboard) 403, thermoelectric cooling (TEC) devices (409a, 409b, 409c, 409d) and TEC controllers 411 which are embedded in the IT equipment. In an embodiment, a CDU 421 is outside the immersion tank 401, including a fluid pump 427, a liquid-air heat exchanger 425 and a CDU controller 423. In an embodiment, the liquid-air heat exchanger 425 can perform its heat exchange function by using liquid, air or a combination thereof. In an embodiment, the CDU 421 is connected with immersion tank 401 through fluid port 415, 419. In an embodiment, the dielectric fluid 405 flows through the perforated panel 417 from the fluid port 419 and exits immersion tank through the fluid port 415.

In an embodiment, the Board Management Controller (BMC) 407 can read GPU power/temperature/fluid inlet temperature (temperature sensor 413 is located near the perforated panel 417), can send control single to an on-board TEC controller 411 and CDU controller 423.

In an embodiment, the on-board TEC controller 411 provides current to each TEC device (409a, 409b, 409c, 409d). For example, the TEC device (409a, 409b, 409c, 409d) is not functioning without current. The TEC controller 411 can regulate the current upon receiving the control signal from Board Management Controller (BMC) 407 according to an embodiment. In an embodiment, the CDU controller 423 can send a control signal to the fluid pump 427 to change the pump speed.

In an embodiment, the immersion cooling system 400 is featured heating mode via TEC devices. For example, when this immersion system 400 is used as edge computing equipment, the dielectric fluid 405 temperature may be so low that it causes computing chip is not able to start. In an embodiment, under this condition, TEC device (409a, 409b, 409c, 409d) can be controlled to work in a heating mode, yet with no additional heating source needed.

Further, the voltage and current in TEC (409a, 409b, 409c, 409d) can be reversed under the heating mode according to an embodiment. For example, the TEC device (409a, 409b, 409c, 409d) can work as a heat pump which moves the energy from liquid (lower temperature) to the chip (higher temperature) so that the chip is preheated to a desired temperature. In an embodiment, after the chip is able to start, the TEC stops working in a heat mode.

In an embodiment, this immersion cooling system can perform self-protection via TEC devices when the pump fails. For example, upon pump failure the fluid is not driven by external force any more. In an embodiment, as chips keep generating heat, the fluid temperature keeps increasing. In an embodiment, fluid may become hot so fast that IT equipment is not able to finish backing up data or to transferring the workload before shutting down. In an embodiment, with higher TEC current, the TEC controller is able let TEC device cool the chip when fluid temperature is high, and this gives a larger time window for the system to finish necessary operations before shutting down.

In an embodiment, the procedures to obtain thermal resistance $\hat{R}_{th,hs}$ values during commissioning run can be obtained as follow. First, a thermocouple is placed between heatsink base and TEC to measure the temperature of heat sink base. Then a maximum pump speed $v_{pump,max}$ is set. The TEC current is shut down, so that TEC device is not functioning. The server is then turned on and a work load with the chip power $\hat{Q}_0$ (as long as the system without TEC device is able to dissipate this amount of power) is applied. For example, when the system reaches a steady state, the system reads the temperature of heat sink base $\hat{T}_{hs,b}$ to obtain:

$$\hat{R}_{th,hs} = \frac{\hat{T}_{hs,b} - T_{liquid,in}}{\hat{Q}_0}$$

Figure 6:
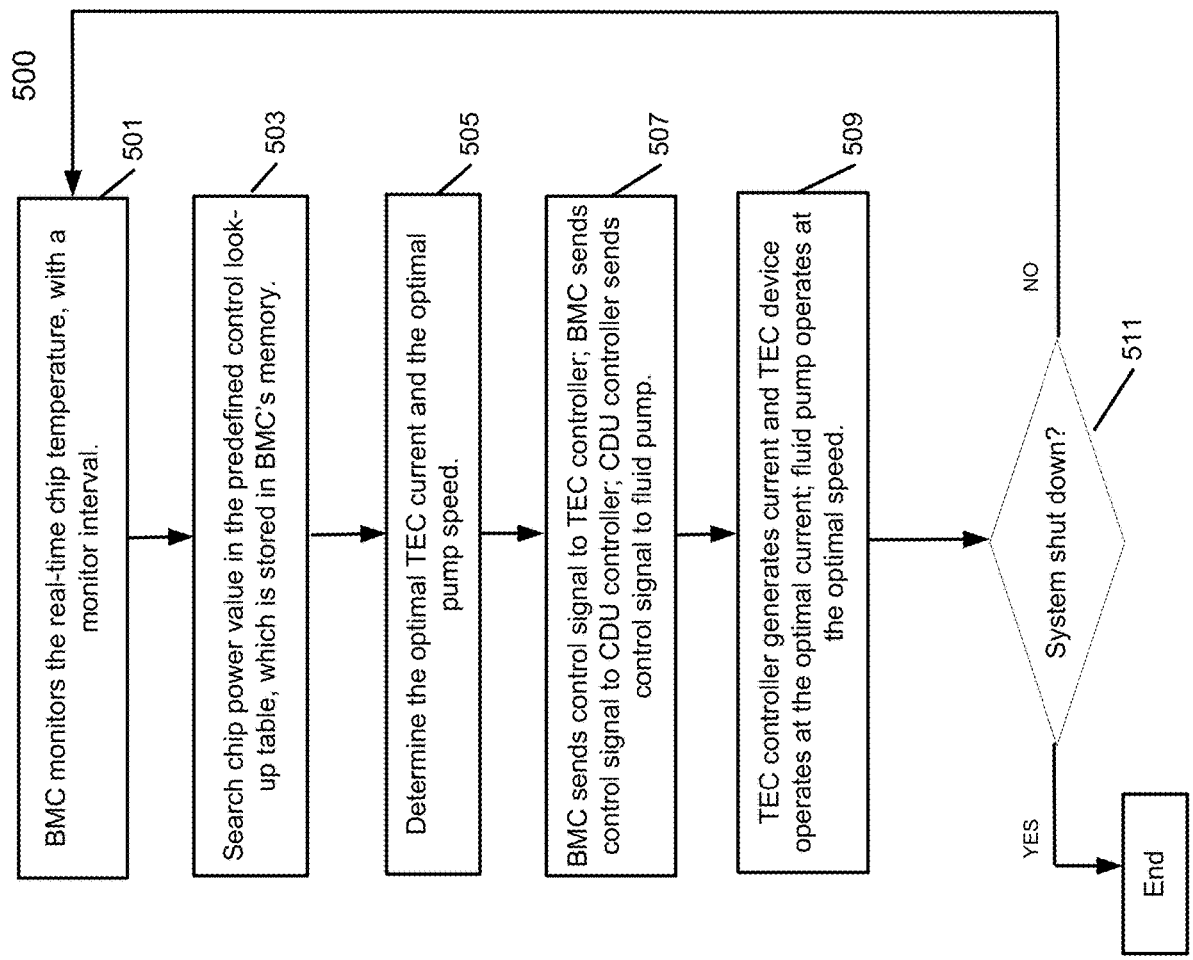
FIG. 6 is a flow diagram of an example process for a thermoelectric cooling system according to an embodiment of the application.

FIG. 6 is a flow diagram of an example process 500 for a cooling system according to an embodiment of the application. For example, FIG. 6 shows a control process for the immersion TEC cooling system to minimize cooling power consumption.

At operation 501, the BMC monitors the real-time chip temperature with a monitor interval according to an embodiment. In an embodiment, the BMC is configured to determine a first power value representing a power consumed by an electronic device based on a fluid temperature of cooling fluid that provides liquid cooling to the electronic device. In an embodiment, an emersion tank is to contain the electronic device and the TEC device submerged into the cooling fluid contained therein. In an embodiment, the CDU is located outside of the emersion tank.

At operation 503, the cooling system can search the chip power value in the predefined control look-up table according to an embodiment. For example, the predefined control look-up table is stored in BMC's memory. In an embodiment, the BMC is configured to perform a lookup operation in a first control lookup table based on the first fluid temperature. In an embodiment, the first control lookup table is corresponding to the first power value. In an embodiment, the first control lookup table is one of a plurality of control lookup tables, each control lookup table corresponding to a particular power value. In an embodiment, the cooling system selects the first control lookup table from the plurality of control lookup tables base on the first power value.

At operation 505, the cooling system can determine the optimal TEC current and the optimal pump speed according to an embodiment. For example, the BMC is configured to determine an optimal TEC current and an optimal pump speed based on the lookup operation. In an embodiment, the optimal TEC current and the optimal pump speed are determined based on the lookup operation, such that power consumption of the cooling system reaches minimum while satisfying a thermal requirement of the electronic device.

At operation 507, the BMC sends control to TEC controller according to an embodiment. In an embodiment, the BMC sends a control signal to the CDU controller. In an embodiment, the CDU controller sends a control signal to the fluid pump. In an embodiment, the BMC is configured to determine the first power value based on the fluid temperature that is measured within a predetermined time period.

At operation 509, the TEC controller generates a current and the TEC device operates at the optimal current according to an embodiment. In an embodiment, fluid pump operates at the optimal speed. For example, the TEC controller is to receive a first control signal from the BMC and to control a TEC device attached to the electronic device to cause the first TEC current to flow within the TEC device. In an embodiment, the CDU controller is to receive a second control signal from BMC to configure a pump speed of a fluid pump of the CDU according to the first pump speed. In an embodiment, the TEC controller is configured to cause the TEC current to flow in a second direction within the TEC device when the fluid temperature rises above a second predetermined temperature threshold, which causes the TEC device to operate in a cooling mode.

At operation 511, the cooling system can decide whether the cooling system should shut down according to an embodiment. If not, then the system moves back the operation 501 according to an embodiment. If yes, then the process ends.

Figure 7:
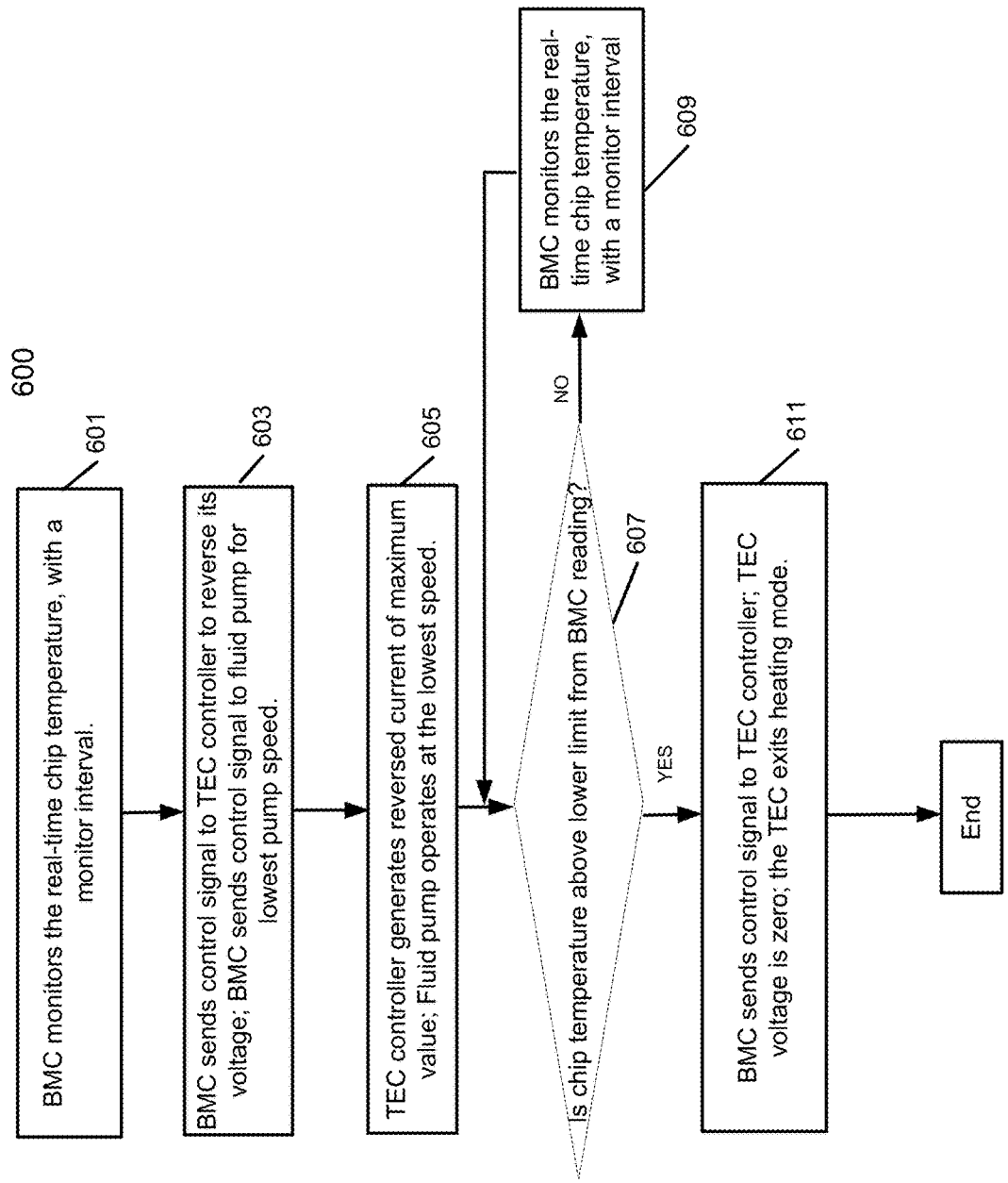
FIG. 7 is another flow diagram of an example process for a thermoelectric cooling system under a heating mode according to another embodiment of the application.

FIG. 7 is a flow diagram of an example process 600 for a cooling system according to an embodiment of the application. For example, FIG. 7 shows a control process for the immersion TEC cooling system to start in a cold weather.

At operation 601, the BMC monitors the real-time chip temperature with a monitor interval according to an embodiment. At operation 603, the system sends control signal to TEC controller to reverse its voltage according to an embodiment. For example, the TEC controller is configured to cause a TEC current to flow in a first direction within the TEC device when the fluid temperature drops below a first predetermined temperature threshold, which causes the TEC device to operate in a heating mode. In an embodiment, the BMC sends control signal to fluid pump for lowest pump speed.

At operation 605, the TEC controller generates reversed current of maximum value which the fluid pump operates at the lowest speed according to an embodiment. At operation 607, the BMC decides whether the chip temperature is above lower limit from BMC reading. If not, then the process moves the operation 609, which the BMC monitors the real-time chip temperature, with a monitor interval. If yes, then the process moves the operation 611, which BMC sends control signal to TEC controller; the TEC voltage is zero; the TEC exits the heating mode.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system, comprising:
    a board management controller (BMC) configured to
        determine a first power value representing a power consumed by an electronic device,
        perform a lookup operation in a control lookup table based on the first power value, and
        determine a first thermoelectric cooling (TEC) current and a first pump speed based on the lookup operation;
    a TEC controller to control a TEC device attached to the electronic device to cause the first TEC current to flow within the TEC device; and
    a cooling distribution unit (CDU) controller to configure a pump speed of a fluid pump of a CDU according to the first pump speed, wherein the CDU is to provide liquid cooling to the electronic device.

2. The cooling system of claim 1, wherein the control lookup table comprises a plurality of entries, wherein each entry maps a particular power value to an optimal TEC current and an optimal pump speed corresponding to that particular power value.

3. The cooling system of claim 1, wherein the control lookup table was generated based on prior operational statistics data of a plurality of cooling systems, including determining optimal TEC currents and pump speeds for providing liquid cooling such that power consumption by each cooling system reaches minimum.

4. The cooling system of claim 1, further comprising an emersion tank to contain the electronic device and the TEC device submerged into the cooling fluid contained therein.

5. The cooling system of claim 4, wherein the CDU is located outside of the emersion tank.

6. The cooling system of claim 1, wherein the BMC is configured to monitor operations of the electronic device for a predetermined period of time to obtain the first power value.

7. The cooling system of claim 1, wherein the first TEC current and the first pump speed are determined based on the lookup operation, such that power consumption of the cooling system reaches minimum while satisfying a thermal requirement of the electronic device.

8. The cooling system of claim 1, wherein the TEC controller is configured to cause a TEC current to flow in a first direction within the TEC device when a fluid temperature of a fluid of the liquid cooling drops below a first predetermined temperature threshold, which causes the TEC device to operate in a heating mode.

9. The cooling system of claim 8, wherein the TEC controller is configured to cause the TEC current to flow in a second direction within the TEC device when the fluid temperature rises above a second predetermined temperature threshold, which causes the TEC device to operate in a cooling mode.

10. An electronic rack of a data center, comprising:
    one or more electronic devices operating as one or more servers; and
    a cooling system coupled to the one or more electronic devices, the cooling system including
        a board management controller (BMC) configured to
            determine a first power value representing a power consumed by an electronic device,
            perform a lookup operation in a control lookup table based on the first power value, and
            determine a first thermoelectric cooling (TEC) current and a first pump speed based on the lookup operation;
        a TEC controller to control a TEC device attached to the electronic device to cause the first TEC current to flow within the TEC device; and
        a cooling distribution unit (CDU) controller to configure a pump speed of a fluid pump of a CDU according to the first pump speed, wherein the CDU is to provide liquid cooling to the electronic device.

11. The electronic rack of claim 10, wherein the control lookup table comprises a plurality of entries, wherein each entry maps a particular power value to an optimal TEC current and an optimal pump speed corresponding to that particular power value.

12. The electronic rack of claim 11, wherein the control lookup table was generated based on prior operational statistics data of a plurality of cooling systems, including determining optimal TEC currents and pump speeds for providing liquid cooling such that power consumption by each cooling system reaches minimum.

13. The electronic rack of claim 10, further comprising an emersion tank to contain the electronic device and the TEC device submerged into the cooling fluid contained therein.

14. The electronic rack of claim 13, wherein the CDU is located outside of the emersion tank.

15. The electronic rack of claim 10, wherein the BMC is configured to monitor operations of the electronic device for a predetermined period of time to obtain the first power value.

16. The electronic rack of claim 10, wherein the first TEC current and the first pump speed are determined based on the lookup operation, such that power consumption of the cooling system reaches minimum while satisfying a thermal requirement of the electronic device.

17. The electronic rack of claim 10, wherein the TEC controller is configured to cause a TEC current to flow in a first direction within the TEC device when a fluid temperature of a fluid of the liquid cooling drops below a first predetermined temperature threshold, which causes the TEC device to operate in a heating mode.

18. The electronic rack of claim 17, wherein the TEC controller is configured to cause the TEC current to flow in a second direction within the TEC device when the fluid temperature rises above a second predetermined temperature threshold, which causes the TEC device to operate in a cooling mode.

19. A method for providing liquid cooling, comprising:
determining a first power value representing a power consumed by an electronic device;
performing a lookup operation in a control lookup table based on the first power value;
determining a first thermoelectric cooling (TEC) current and a first pump speed based on the lookup operation;
causing the first TEC current to flow within a TEC device; and
configuring a pump speed of a fluid pump of a cooling distribution unit (CDU according to the first pump speed, wherein the CDU is to provide liquid cooling to the electronic device.

20. The method of claim 19, wherein the control lookup table comprises a plurality of entries, wherein each entry maps a particular power value to an optimal TEC current and an optimal pump speed corresponding to that particular power value.

* * * * *